(12) United States Patent
Boussagol et al.

(10) Patent No.: US 7,939,428 B2
(45) Date of Patent: May 10, 2011

(54) METHODS FOR MAKING SUBSTRATES AND SUBSTRATES FORMED THEREFROM

(75) Inventors: Alice Boussagol, Brignoud (FR); Bruce Faure, Grenoble (FR); Bruno Ghyselen, Seyssinet (FR); Fabrice Letertre, Meylan (FR); Olivier Rayssac, Grenoble (FR); Pierre Rayssac, legal representative, Grenoble (FR); Gisèle Rayssac, legal representative, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 12/914,194

(22) Filed: Oct. 28, 2010

(65) Prior Publication Data

US 2011/0039368 A1  Feb. 17, 2011

Related U.S. Application Data

(60) Continuation of application No. 12/536,082, filed on Aug. 5, 2009, now Pat. No. 7,839,001, which is a division of application No. 11/840,696, filed on Aug. 17, 2007, now Pat. No. 7,615,468, which is a continuation-in-part of application No. 11/505,668, filed on Aug. 16, 2006, now abandoned.

(30) Foreign Application Priority Data

Nov. 27, 2000 (FR) ..................................... 00 15279
Jun. 11, 2002 (FR) ..................................... 02 07132
Jan. 24, 2003 (FR) ..................................... 03 00780
Dec. 21, 2005 (FR) ..................................... 05 13045

(51) Int. Cl.
*H01L 21/46* (2006.01)
*H01L 21/30* (2006.01)
*H01L 21/762* (2006.01)

(52) U.S. Cl. ................ 438/459; 438/455; 257/E21.567; 257/E21.568; 257/E21.569; 257/E21.57

(58) Field of Classification Search .................. 438/459, 438/455; 257/E21.567, E21.568, E21.569, 257/E21.57
See application file for complete search history.

(56) References Cited

U.S. PATENT DOCUMENTS 4,001,864 A  1/1977 Gibbons ....................... 136/255
(Continued)

FOREIGN PATENT DOCUMENTS

EP  0 193 830 A2  9/1986
(Continued)

OTHER PUBLICATIONS

Aspar et al., "Smart-Cut® process using metallic bonding: application to transfer of Si, GaAs, InP thin films," Electronics Letters, 35(12): 1024-1025 (1999).
(Continued)

*Primary Examiner* — Luan C Thai
(74) *Attorney, Agent, or Firm* — Winston & Strawn LLP

(57) ABSTRACT

A method for making substrates for use in optics, electronics, or opto-electronics. The method may include transferring a seed layer onto a receiving substrate and depositing a useful layer onto the seed layer. The thermal expansion coefficient of the receiving support may be identical to or slightly larger than the thermal expansion coefficient of the useful layer and the thermal expansion coefficient of the seed layer may be substantially equal to the thermal expansion coefficient of the receiving support. Preferably, the nucleation layer and the intermediate support have substantially the same chemical composition.

20 Claims, 4 Drawing Sheets

U.S. PATENT DOCUMENTS

| | | | |
|---|---|---|---|
| 4,255,211 A | 3/1981 | Fraas | 136/249 |
| 4,338,480 A | 7/1982 | Antypas et al. | 136/249 |
| 4,612,408 A | 9/1986 | Moddel et al. | 136/244 |
| 4,686,323 A | 8/1987 | Biter et al. | 136/249 |
| 4,692,559 A | 9/1987 | Ellion et al. | 136/262 |
| 5,019,177 A | 5/1991 | Wanlass | 136/249 |
| 5,053,083 A | 10/1991 | Sinton et al. | 136/256 |
| 5,217,539 A | 6/1993 | Fraas et al. | 136/246 |
| 5,229,305 A | 7/1993 | Baker | 438/459 |
| 5,322,572 A | 6/1994 | Wanlass | 136/249 |
| 5,342,453 A | 8/1994 | Olson | 136/262 |
| 5,374,564 A | 12/1994 | Bruel | 438/455 |
| 5,376,185 A | 12/1994 | Wanlass | 136/262 |
| 5,458,694 A | 10/1995 | Nuyen | 136/249 |
| 5,479,032 A | 12/1995 | Forrest et al. | 257/190 |
| 5,479,043 A | 12/1995 | Nuyen | 257/459 |
| 5,759,908 A | 6/1998 | Steckl et al. | 438/479 |
| 5,869,387 A | 2/1999 | Sato et al. | 438/459 |
| 5,877,070 A | 3/1999 | Goesele et al. | 438/458 |
| 5,880,491 A | 3/1999 | Soref et al. | 257/190 |
| 5,944,913 A | 8/1999 | Hou et al. | 136/255 |
| 5,953,622 A | 9/1999 | Lee et al. | 438/458 |
| 5,966,620 A * | 10/1999 | Sakaguchi et al. | 438/455 |
| 5,985,687 A | 11/1999 | Bowers et al. | 438/46 |
| 6,020,252 A | 2/2000 | Aspar et al. | 438/458 |
| 6,103,597 A | 8/2000 | Aspar et al. | 438/458 |
| 6,114,188 A | 9/2000 | Oliver et al. | 438/107 |
| 6,180,432 B1 | 1/2001 | Freeouf | 438/93 |
| 6,190,998 B1 | 2/2001 | Bruel et al. | 438/407 |
| 6,225,192 B1 | 5/2001 | Aspar et al. | 438/460 |
| 6,239,354 B1 | 5/2001 | Wanlass | 136/249 |
| 6,251,754 B1 | 6/2001 | Ohshima et al. | 438/506 |
| 6,252,287 B1 | 6/2001 | Kurtz et al. | 257/461 |
| 6,281,426 B1 | 8/2001 | Olson et al. | 136/249 |
| 6,300,557 B1 | 10/2001 | Wanlass | 136/255 |
| 6,300,558 B1 | 10/2001 | Takamoto et al. | 136/262 |
| 6,303,468 B1 | 10/2001 | Aspar et al. | 438/455 |
| 6,328,796 B1 | 12/2001 | Kub et al. | 117/94 |
| 6,340,788 B1 | 1/2002 | King et al. | 136/261 |
| 6,426,270 B1 | 7/2002 | Sakaguchi et al. | 438/406 |
| 6,482,672 B1 | 11/2002 | Hoffman et al. | 438/94 |
| 6,534,382 B1 | 3/2003 | Sakaguchi et al. | 438/455 |
| 6,548,382 B1 * | 4/2003 | Henley et al. | 438/526 |
| 6,660,928 B1 | 12/2003 | Patton et al. | 136/249 |
| 6,756,286 B1 | 6/2004 | Moriceau et al. | 438/459 |
| 6,794,276 B2 | 9/2004 | Letertre et al. | 438/506 |
| 6,867,067 B2 | 3/2005 | Ghyselen et al. | 438/107 |
| 6,881,644 B2 * | 4/2005 | Malik et al. | 438/409 |
| 6,946,317 B2 | 9/2005 | Faure et al. | 438/94 |
| 6,951,819 B2 | 10/2005 | Iles et al. | 438/705 |
| 7,019,339 B2 | 3/2006 | Atwater, Jr. et al. | 257/184 |
| 7,029,993 B1 | 4/2006 | Barge et al. | 438/475 |
| 7,071,407 B2 | 7/2006 | Faterni et al. | 136/262 |
| 7,141,834 B2 | 11/2006 | Atwater, Jr. et al. | 257/184 |
| 7,238,622 B2 | 7/2007 | Atwater, Jr. et al. | 438/752 |
| 7,341,927 B2 | 3/2008 | Atwater, Jr. et al. | 438/473 |
| 7,755,109 B2 | 7/2010 | Atwater, Jr. et al. | 257/200 |
| 7,785,989 B2 | 8/2010 | Sharps et al. | 438/459 |
| 2002/0117675 A1 | 8/2002 | Mascarenhas | 257/87 |
| 2003/0143772 A1 | 7/2003 | Chen | 438/47 |
| 2003/0203547 A1 | 10/2003 | Sakaguchi et al. | 438/151 |
| 2003/0219959 A1 | 11/2003 | Ghyselen et al. | 438/458 |
| 2003/0232487 A1 | 12/2003 | Letertre et al. | 438/459 |
| 2004/0029359 A1 | 2/2004 | Letertre et al. | 438/458 |
| 2004/0200523 A1 | 10/2004 | King et al. | 136/262 |
| 2004/0235268 A1 | 11/2004 | Letertre et al. | 438/459 |
| 2005/0026394 A1 | 2/2005 | Letertre et al. | 438/459 |
| 2005/0161078 A1 | 7/2005 | Aiken | 136/259 |
| 2005/0266626 A1 | 12/2005 | Faure et al. | 438/197 |
| 2006/0021565 A1 | 2/2006 | Zahler et al. | 117/89 |
| 2006/0112986 A1 | 6/2006 | Atwater, Jr. et al. | 136/255 |
| 2006/0144435 A1 | 7/2006 | Wanlass | 136/249 |
| 2006/0162768 A1 | 7/2006 | Wanlass et al. | 136/262 |
| 2006/0185582 A1 | 8/2006 | Atwater, Jr. et al. | 117/89 |
| 2007/0072324 A1 | 3/2007 | Krames et al. | 438/46 |
| 2007/0131275 A1 | 6/2007 | Kinsey et al. | 136/255 |
| 2007/0218649 A1 | 9/2007 | Hernandez | 438/458 |
| 2007/0277873 A1 | 12/2007 | Cornfeld et al. | 136/255 |
| 2007/0277874 A1 | 12/2007 | Dawson-Elli et al. | 136/256 |
| 2008/0185038 A1 | 8/2008 | Sharps | 136/255 |
| 2008/0211061 A1 | 9/2008 | Atwater, Jr et al. | 257/615 |
| 2008/0245409 A1 | 10/2008 | Varghese et al. | 136/256 |
| 2008/0311686 A1 | 12/2008 | Morral et al. | 438/7 |
| 2009/0038678 A1 | 2/2009 | Pan et al. | 136/255 |
| 2009/0044860 A1 | 2/2009 | Pan et al. | 136/257 |
| 2010/0083999 A1 | 4/2010 | Hovel | 136/244 |
| 2010/0126573 A1 | 5/2010 | Youtsey et al. | 136/255 |
| 2010/0186822 A1 | 7/2010 | Pan et al. | 136/261 |

FOREIGN PATENT DOCUMENTS

| | | |
|---|---|---|
| EP | 0 658 944 B1 | 6/1995 |
| FR | 2 681 472 A1 | 3/1993 |
| FR | 2 774 214 A1 | 7/1999 |
| FR | 2 787 919 A1 | 6/2000 |
| FR | 2 840 730 A1 | 12/2003 |
| FR | 2 878 076 A1 | 5/2006 |
| WO | WO 99/52155 A1 | 10/1999 |
| WO | WO 00/44966 A1 | 8/2000 |
| WO | WO 02/37556 A1 | 5/2002 |
| WO | WO 02/43112 A2 | 5/2002 |
| WO | WO 02/43124 A2 | 5/2002 |
| WO | WO 03/079438 A1 | 9/2003 |
| WO | WO 2005/015638 A1 | 2/2005 |

OTHER PUBLICATIONS

Bruel, "Silicon on insulator material technology," Electronics Letters, 31(14): 1201-1202 (1995).

Hobart et al., "Transfer of ultrathin silicon layers to polycrystalline SiC substrates for the growth of 3C-Sic epitaxial films," J. Electrochem. Soc., 146(10): 3833-3836 (1999).

MacKenzie et al., "Growth of III-Nitrides on ZnO, LiGaO$_2$, and LiAlO$_2$ substrates," J. Electrochem. Soc., 145(7): 2581-2585 (1998).

Motoki et al., "Preparation of large freestanding GaN substrates by hydride vapor phase epitaxy using GaAs as a starting substrate," Jpn. J. Appl. Phys., 40(2B): L140-L143 (2001).

Oda et al., "GaN bulk substrates for GaN based LEDs and LDs," Phys. Stat. Sol. (A), 180(1): 51-58 (2000).

Popovici et al., "Impurity contamination of GaN epitaxial films from the sapphire, SiC, and ZnO substrates," Appl. Phys. Lett., 71(23): 3385-3387 (1997).

Schnitzer et al., "30% external quantum efficiency from surface textured, thin-film light-emitting diodes," Appl. Phys. Lett. 63(16): 2174-2176 (1993).

Steckl et al., "Growth and characterization of GaN thin films on SiC SOI substrates," Journal of Electronic Materials, 26(3): 217-223 (1997).

Zahler et al., "Ge layer transfer to Si for photovoltaic applications," Thin Solid Films, 403-404: 558-562 (2002).

Cornfeld, et al., "Development of a Large Area Inverted Metamorphic Multi-Junction (IMM) Highly Efficient AM0 Solar Cell," 33$^{rd}$ IEEE Photovaoltaic Specialists Conference, pp. 1-5, May 11-16, 2008, San Diego, CA, USA.

Cornfeld et al., "Development of a Large Area Inverted Metamorphic Multi-Junction Highly Efficient AM0 Solar Cell," 33$^{rd}$ IEEE Photovoltaic Specialists Conference (May 11-16, 2008) on May 12, 2008, San Diego, CA, USA, 17 pages.

Cornfeld, et al., "Advances in the Performance of Inverted Metamorphic Multi-Junction Solar Cells," 23$^{rd}$ European Photovoltaic Energy Conference, Sep. 1-5, 2008, Valencia, Spain, 11 pages.

Friedman, et al., "0.7-eV GaInAs Junction for a GaInP/GaAs/GaInAs(1eV)GaInAs(0.7eV) Four-Junction Solar Cell," 2006 IEEE 4$^{tha}$World Conference on Photovoltaic Energy Conversion, pp. 598-602, May 7-12, 2006, Waikoloa, HI, USA.

Geisz, et al., "High-efficiency GaInP/GaAs/InGaAs triple-junction solar cells grown inverted with a metamorphic bottom junction," Applied Physics Letters 91:023502-1-023502-3 (2007).

Geisz, et al., "Inverted GaInP / (In)GaAs / InGaAs Triple-Junction Solar Cells with Low-Stress Metamorphic Bottom Junctions," 33$^{rd}$ IEEE Photovoltaic Specialists Conference, pp. 1-5, May 11-16, 2008, San Diego, CA, USA.

King et al., "Next-Generation, High-Efficiency III-V Multijunction Solar Cells," 28th IEEE Photovoltaic Specialists Conference, pp. 998-101, Sep. 15-22, 2000, Anchorage, AK, USA.

King, et al., "High Efficiency Space and Terrestrial Multijunction Solar Cells Through Bandgap Control in Cell Structures," 2002 Photovoltaic Specialists Conference, Conference Record of the 29th IEEE, pp. 776-781, May 19-24, 2002, New Orleans, LA, USA.

Sharps, et al., "Inverting the triple junction improves efficiency and flexibility," Compound Semiconductor, 13(9): 25-28 (2007).

Sinharoy, et al., "Progress in the Development of Metamorphic Multi-Junction III-V Space Solar Cells," Progress in Photovoltaics: Research and Applications, 10(6):427-432 (2002).

Stan, et al., "Very High Efficiency Triple Junction Solar Cells by MOVPE," 14th International Conference of Metalorganic Vapor Phase Epitaxy, Jun. 1-6, 2008, Metz, France, 32 pages.

Takamoto et al., "InGaP/GaAs-based Multijunction Solar Cells," Progress in Photovoltaics: Research and Applications, 13:495-511 (2005).

Venkatasubramanian, et al., "An Inverted-Growth Approach to Development of an IR-Transparent, High-Efficiency AlGaAs/GaAs Cascade Solar Cell," 22nd IEEE Photovoltaic Specialists Conference, vol. 1, pp. 93-98, Oct. 7-11, 1991, Las Vegas, NV, USA.

Wanlass et al., "Lattice-Mismatched Approaches for High-Performance, III-V Photovoltaic Energy Converters," Proceedings of the 31st IEEE Photovoltaic Specialists Conference and Exhibition, pp. 530-535, Jan. 3-7, 2005, Lake Buena Vista, FL, USA.

Wanlass et al., "Monolithic, Ultra-Thin GaInP/GaAs/GaInAs Tandem Solar Cells," 2006 IEEE 4th World Conference on Photovoltaic Energy Conversion, pp. 729-732, May 7-12, 2006, Waikoloa, Hawaii, USA.

Wurfel, "Physics of Solar Cells: from Basic Principles to Advanced Concepts," Second, Updated and Expanded Edition, 2009, Sections 6.4, 6.5 and 6.8, 20 pages, Wiley-VCH, Weinheim, Germany.

Yamaguchi, "Physics and Technologies of Superhigh-Efficiency Tandem Solar Cells," Semiconductors, 33(9):961-964 (1999).

Yoon, et al., "Progress of Inverted Metamorphic III-V Solar Cell Development at Spectrolab," 33rd IEEE Photovoltaic Specialists Conference, pp. 1-6, May 11-16, 2008, San Diego, CA, USA.

Partial European Search Report, Application No. EP 08 01 3466, Feb. 12, 2009.

* cited by examiner

METHODS FOR MAKING SUBSTRATES AND SUBSTRATES FORMED THEREFROM

CROSS-REFERENCE TO RELATED APPLICATIONS

This application is a continuation of application Ser. No. 12/536,082, filed on Aug. 5, 2009, now U.S. Pat. No. 7,839,001, which in turn is a division of application Ser. No. 11/840,696, filed on Aug. 17, 2007, now U.S. Pat. No. 7,615,468, which is a continuation-in-part of application Ser. No. 11/505,668, filed on Aug. 16, 2006, now abandoned. The entire content of each prior application is expressly incorporated herein by reference thereto.

FIELD OF THE INVENTION

The present invention relates to methods for making substrates and substrates for use in optics, electronics or opto-electronics and, in particular, substrates which may be used for making solar cells, light-emitting diodes and lasers.

BACKGROUND OF THE INVENTION

In the field of substrates for optics, electronics or opto-electronics, two main types of methods are well known for forming a thin layer on a supporting substrate. According to a first type of method, a thin layer taken from a donor substrate is transferred onto a receiving supporting substrate to obtain substrates including a thin useful layer. Useful layer is the layer of the substrate on which electronic components such as, for example, light-emitting diodes or other components may be made.

According to second type of method, the thin layer is deposited on a receiving supporting substrate by a deposition technique. This deposition technique may notably consist of epitaxy or chemical vapor deposition. Regardless of the type of method used for forming a useful layer on a receiving supporting substrate, in some instances it is necessary to remove at least one portion of the receiving support to obtain a final substrate including at least the useful layer. Such removal of the receiving support results in loss of materials, thereby putting a strain on the manufacturing costs of such substrates.

In order to find a remedy to this drawback, a method for making substrates has been devised which includes a useful thin layer method in which the receiving supporting substrate is removed in order to be recycled. Such a method is described in an alternative embodiment of U.S. Pat. No. 6,794,276, which describes a method for making substrates. This method includes a step for transferring a seed layer on a receiving support by molecular adhesion at a bonding interface, a step for epitaxy of a useful layer on the seed layer and a step for applying stresses in order to lead to removal of the assembly (i.e., removal of the seed layer and of the useful layer from the receiving support at the bonding interface). Seed layer is the material layer which allows development of the epitaxied useful layer.

In U.S. Pat. No. 6,794,276, certain specifications are required for allowing the seed layer to adapt to thermal expansions of the receiving support and the useful layer during heat treatments to which the substrate is subject. For this purpose, it is recommended that the seed layer has sufficiently small thickness, of the order of 0.5 microns, and preferably less than 1,000 ANG. U.S. Pat. No. 6,794,276 also mentions the fact that the receiving support consists of a material for which the thermal expansion coefficient is 0.7 to 3 times larger than that of the useful layer. It is specified that the thermal expansion coefficient is the proportionality coefficient of the change in the length of a solid as a function of the initial length of the solid and of its change in temperature according to the following formula:

$\Delta L = \alpha L_0 \Delta T$ where $\alpha$=thermal expansion coefficient

In an alternative embodiment, the method taught by U.S. Pat. No. 6,794,276 allows the receiving supporting substrate to be reused after its removal.

It is desirable to improve the method taught by U.S. Pat. No. 6,794,276. In particular, improvements are needed for reducing the risk of breaking the substrate, deteriorating, cracking the seed layer or the occurrence of a residual deflection of the final substrate making it unusable during the various heat treatments applied to the substrate. These improvements are now provided by the present invention.

SUMMARY OF THE INVENTION

The invention relates to a method for making substrates for optics, electronics, or opto-electronics which includes providing a donor substrate and a receiving substrate, wherein the receiving substrate has a thermal expansion coefficient; operably connecting the donor substrate to the receiving substrate; forming a seed layer on the receiving substrate, wherein the seed layer has a surface and a thermal expansion coefficient; and epitaxy of a useful layer on the seed layer, wherein the useful layer has a thermal expansion coefficient. Advantageously, the thermal expansion coefficient of the receiving substrate is equal to or greater than the thermal expansion coefficient of the useful layer, and the thermal expansion coefficient of the seed layer is about the same as the thermal expansion coefficient of the receiving substrate so that the seed layer and the receiving support expand in substantially the same way to avoid stressing or deforming the seed layer. Preferably, the nucleation layer and the intermediate support have substantially the same chemical composition.

In another embodiment, the method for making substrates includes providing a donor substrate and a receiving support; forming a seed layer from the donor substrate; transferring the seed layer onto the receiving support; and forming a useful layer on the seed layer. Again, the thermal expansion coefficient of the receiving support is equal to or greater than the thermal expansion coefficient of the useful layer, and the thermal expansion coefficient of the seed layer is about equal to the thermal expansion coefficient of the receiving support so that the seed layer and the receiving support expand in substantially the same way to avoid stressing or deforming the seed layer.

Thus, during subsequent heat treatments which the structure will undergo, the seed layer and the receiving support may substantially expand in the same way. The receiving support may expand slightly less than the seed layer so that the seed layer may be placed under slight compression avoiding any deterioration of the seed layer.

In a preferred embodiment, the seed layer may consist of a material for which the thermal expansion coefficient is equal to $(1+\in)$ times that of the receiving support, with $\in$ of the order of 0.2, and preferably $\in$ equals 0.1. Further, the useful layer may consist of a material for which the thermal expansion coefficient may be larger than or equal to $(1\pm\in')$ times that of the receiving support, with a typical value of 0.2 for $\in'$. The seed layer and/or the receiving support may be made of, for example, silicon, germanium, silicon carbide, GaN or sapphire. Moreover, the chemical composition of the seed layer, advantageously, may be identical to that of the receiving support.

A composite substrate may be created using the method described herein. The composite substrate may be used for optics, electronics, or opto-electronics. The substrate may have at least one seed layer on a receiving support, and an epitaxied useful layer on the seed layer. The thermal expansion coefficient of the receiving support may be identical to or slightly larger than the thermal expansion coefficient of the useful layer, and the thermal expansion coefficient of the seed layer may be substantially equal to the thermal expansion coefficient of the receiving support so that the seed layer and the receiving support expand in substantially the same way to avoid stressing or deforming the seed layer.

Other advantages and features will become better apparent from the description which follows of several alternative embodiments, given as non-limiting examples, of the method for making substrates according to the invention as well as of the substrate obtained by the method.

Another embodiment relates to a method of manufacturing a solar cell, which comprises providing a donor substrate; providing a support substrate; bonding the donor substrate and the support substrate to produce a composite structure wherein one or both of the bonding surfaces of the donor substrate and the support substrate have been prepared for bonding; detaching the bulk of the donor substrate, leaving a semiconductor seed layer on the receiving substrate; depositing a sequence of layers of semiconductor material forming a solar cell on the semiconductor seed layer; bonding a final support substrate on top of the sequence of layers of semiconductor material forming the solar cell; and removing the support substrate and the semiconductor seed layer leaving the sequence of layers of semiconductor material forming the solar cell.

In this method, the removing of the support substrate further comprises detaching the final support substrate, the sequence of layers and the seed layer from the support substrate. The removing can also be achieved by applying a chemical treatment to remove at least one of the support substrate or the semiconductor seed layer. A typical chemical treatment comprises etching with an acid solution.

The method can also include preparing for bonding one or both of the bonding surfaces of the donor substrate and the support substrate by forming a bonding layer thereon. The bonding typically comprises molecular adhesion of the prepared bonding surface of the donor substrate directly to a surface of the receiving substrate.

The seed layer can be prepared to receive the sequence of layers of semiconductor material, wherein the preparation includes at least one of polishing, annealing, smoothing, oxidation, and etching.

The bulk of the donor substrate can be detached from the composite structure by implanting a species into the donor substrate to form a detachment zone defining a seed layer in the donor substrate; bonding the seed layer to the receiving substrate; and detaching the bulk of the donor substrate from the composite structure, leaving the seed layer bonded on the receiving substrate.

The bulk of the donor substrate can also be detached from the composite structure by treating the composite structure at an elevated temperature to weaken the donor substrate at the detachment zone; and detaching the bulk of the donor substrate from the composite structure along the detachment zone after or during heat treatment of the composite structure. The detaching typically comprises application of at least one of mechanical stress and chemical etching, or a combination thereof. Also, the method further comprises removing the support substrate for recycling and reuse.

Preferred seed layers comprise gallium arsenide or germanium, while a preferred support substrate comprises sapphire. The semiconductor material may comprise one or more of InP, AsGa, GaInP, InGaAs, InGaAlP, or InGaAsN. Also, the receiving substrate and seed layer are typically made of a material selected from the group consisting of silicon, gallium arsenide, zinc oxide, lithium gallium oxide and lithium aluminum oxide, while a preferred bonding layer comprises at least one of silicon oxide or silicon nitride. The final support substrate comprises at least one of monocrystalline or polycrystalline silicon or sapphire.

Further aspects and details and alternate combinations of the elements of this invention will be apparent from the following detailed description and are also within the scope of the inventor's invention.

BRIEF DESCRIPTION OF THE DRAWINGS

The present invention can be better understood by reference to the following drawings, wherein like references numerals represent like elements. The drawings are merely exemplary to illustrate certain features that may be used singularly or in combination with other features and the present invention should not be limited to the embodiments shown.

DETAIL DESCRIPTION OF THE PREFERRED EMBODIMENTS

Figure 1:
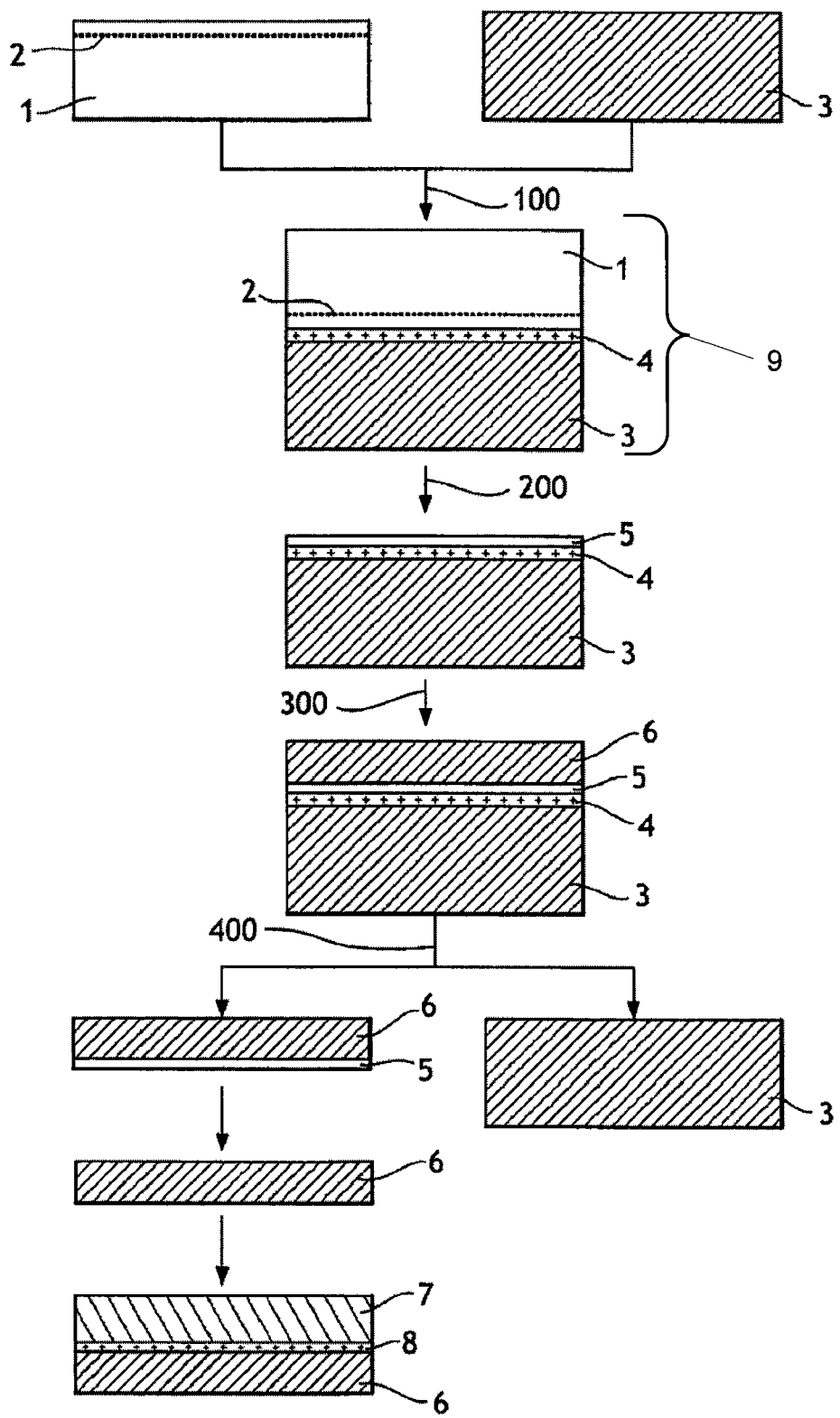
FIG. 1 is a schematic illustration of the steps of an exemplary embodiment of a method for making a substrate.

Throughout this application, the term "donor substrate" is also referred to as a "source substrate" or a "semiconductor carrier," and vice versa. Also, the term "receiving substrate" is also used to refer to an "intermediate support," a "support substrate" or a "support layer," and vice versa, as appropriate for the embodiment. The term "seed layer" is also referred to as a "nucleation layer" or a "growth substrate," and vice versa. In some contexts, the term "growth substrate" is also used to refer to a seed layer bonded to a support substrate. The term "detachment zone" is also referred to as a "weakened zone," and vice versa. The term "final support" is sometimes referred to as a "target substrate" or a "surrogate second substrate," and vice versa.

The invention relates to methods for fabricating a semiconductor substrate. In an implementation, the method includes providing an intermediate support 20, providing a nucleation layer 12, and providing at least one bonding layer 13 or 23 between the intermediate support 20 and the nucleation layer 12 to improve the bonding energy therebetween, and to form an intermediate assembly. The technique also includes providing at least one layer of a semiconductor material 30 upon the nucleation layer 12, bonding a target substrate 40 to the deposited semiconductor material to form a support assembly that includes the target substrate 40, the deposited semiconductor material, and the intermediate assembly, and then processing the support assembly to remove the intermediate assembly. The result is a semiconductor substrate that includes the at least one layer of semiconductor material 30 on the target substrate 40. Preferably, the intermediate assembly is conveniently removed by etching, such as with an acid solution.

Preferably, the nucleation layer 12 functions as a barrier layer against diffusion of atoms from the intermediate support 20 at epitaxial growth temperatures, and the semiconductor material layer 30 is epitaxially deposited on the nucleation layer 12. If desired, a second barrier layer may be provided between the nucleation layer 12 and the intermediate support 20 prior to epitaxially depositing the semiconductor material layer. In an advantageous embodiment, the intermediate support 20 includes a barrier layer that is resistant to diffusing elements derived from dissociation of the intermediate support 20 at epitaxial growth temperatures, and the semiconductor material is epitaxially deposited on the nucleation layer 12. In an implementation, the barrier layer is first applied to the intermediate support and then the nucleation layer is applied to the barrier layer. A layer of adhesive may be applied to at least one of a surface of the barrier layer or a surface of the nucleation layer to define a bonding layer 13 or 23. Generally, at least one of the barrier layer or the nucleation layer 12 is formed by a deposition technique.

The intermediate assembly is advantageously provided by implanting atomic species into at least a portion of a source substrate 10 to define the nucleation layer 12, wherein a main concentration of implanted atomic species defines a detachment zone 14, applying the at least one bonding layer 13 or 23 to at least one of a surface of the nucleation layer 12 or to at least a portion of a surface of the intermediate support 20, attaching the source substrate 10 implanted with the atomic species, the at least one bonding layer 13 or 23, and at least a portion of the intermediate support 20 together to form a structure, and treating the structure to detach the intermediate assembly from the source substrate at the detachment zone 14.

According to this aspect of the invention, the intermediate support 20 is preferably selected from the group consisting of sapphire, silicon, gallium arsenide, zinc oxide, lithium gallium oxide and lithium aluminum oxide. In addition, the nucleation layer 12 may include at least one of silicon carbide, gallium nitride, or sapphire. The semiconductor material also preferably is made of at least one of a mono or poly-metallic nitride or arsenide, and in particular gallium nitride. The nucleation layer 12 is preferably selected from the group consisting of silicon carbide, gallium arsenide, gallium nitride and sapphire. If desired, the final support assembly may further include a reflective coating.

Preferably, the at least one bonding layer 13 or 23 is made of at least one of silicon oxide or silicon nitride. The target substrate 40 may be made of at least one of monocrystalline or polycrystalline silicon. Advantageously, the final support 40 is chemically treated to remove at least one of the intermediate support 20 or the nucleation layer 12.

Another aspect of a method for fabricating a semiconductor substrate according to the invention includes transferring a seed layer 12 on to a support substrate 20, depositing a working layer 30 on the seed layer 12 to form a composite substrate, and detaching the seed layer 12 and the working layer 30 from the composite substrate to form the semiconductor substrate. In this implementation, the material of the seed layer 12 is suitable for accommodating the thermal expansion of the support substrate 20 and the thermal expansion of the working layer 30.

Preferably, the support substrate 20 comprises a material having thermal expansion coefficients that minimize stresses that arise during variations in temperature. Advantageously, the seed layer 12 is transferred onto the support substrate 20 by molecular adhesion. In an implementation, the seed layer 12 and the working layer 30 are detached from the composite substrate by the application of stress at the adhesion interface, wherein the stress is selected from the group consisting of mechanical stress, thermal stress, electrostatic stress and laser irradiation stress, or a combination thereof.

In an implementation, the working layer 30 is made of gallium nitride. In addition, the seed layer 12 may be made of a material from the group consisting of sapphire, silicon carbide, zinc oxide, silicon, gallium nitride, gallium arsenide, neodymium gallate, and lithium gallate. The support substrate 20 may be made of a material selected from the group consisting of silicon carbide, aluminum nitride, silicon, and sapphire. Advantageously, the seed layer 12 and the support substrate 20 have substantially the same chemical composition.

In a beneficial embodiment, the method further includes applying an intermediate layer between the seed layer 12 and the support substrate 20. The intermediate layer may be at least one of a bonding layer 13 or 23 or an insulating layer.

Preferably, the seed layer 12 includes a crystal lattice parameter sufficient for the epitaxial growth of the working layer 30 on the seed layer 12 such that the working layer 30 has a dislocation concentration less than about $10^7/cm^2$. An advantageous implementation includes providing a source substrate 10 including the seed layer 12 and a weakened zone 14, and detaching the seed layer 12 from the source substrate at 10 the weakened zone 14, and transfer it to the intermediate support 20. In this embodiment, the weakened zone 14 includes implanted atomic species at a depth that corresponds to the thickness of the source substrate 10, and the seed layer 12 may be detached from the source substrate 10 by application of at least one of heat treatment, mechanical stress, chemical etching, or a combination thereof.

The method according to this aspect of the invention preferably further includes preparing the seed layer 12 to receive the working layer 30, wherein the preparation includes at least one of polishing, annealing, smoothing, oxidation, and etching. The method may also advantageously include removing the support substrate 20 such that it remains in a condition sufficient for recycling and reuse.

With reference to FIG. 1, the method according to the invention includes a step for implanting atomic species at a determined depth in a donor substrate (or semiconductor carrier) 1 in order to form a weakened area 2. In step 100, the donor substrate may be bonded upon or otherwise adhered onto a receiving substrate (or support substrate) 3 by any appropriate means known in the art to form composite structure 9.

As referred to below, bonding may mean intimate contact of the donor substrate 1 with the receiving substrate 3 in order to join the donor substrate 1 and the receiving substrate 3 by molecular adhesion. Bonding may be obtained according to various methods such as, for example, (1) having a surface of the donor substrate 1 come into direct contact with a surface of the receiving substrate; (2) forming a bonding layer in order to make a connecting layer on the surface of the donor substrate 1, forming a bonding layer in order to make a second connecting layer on the surface of the receiving substrate 3 and having the surfaces of the respective connecting layers of the donor substrate 1 and the donor substrate 3 come into contact with each other; and (3) forming a bonding layer on only one of both substrates.

In one embodiment, the bonding layer may consist of, for example, an insulating layer or a dielectric layer. In such an embodiment, the donor substrate 1 may be bonded onto the receiving substrate 3 by means of a bonding layer 4 deposited on the surface of the donor substrate and/or the receiving substrate 3. In addition, an annealing step may be applied at this stage for strengthening the bonding interface between the bonding layer 4 and the surface of the donor substrate 1 and/or the receiving substrate 3. Nonetheless, bonding may be achieved according to any of the methods known to one skilled in the art.

In step 200, a seed layer (or growth substrate) 5 may be detached from the donor substrate 1 at the weakened area 2. Thereafter, in step 300 a useful layer 6 (o useful layers) may be deposited on the surface of the seed layer 5. In one preferred embodiment, the useful layer 6 may be obtained by epitaxy, which is well known to one skilled in the art, according to step 300. The step 200 for implanting atomic species and for detaching the seed layer 5 corresponds to a SMART-CUT® method, a general description of which is found in the publication Silicon-On-Insulator Technology Materials to VLSI, 2nd Edition of Jean-Pierre Colinge, Kluwer Academic Publishers, p. 50 and 51. Those skilled in the art will appreciate that detachment of the seed layer 5 and of the donor substrate 1 may be achieved by an operation such as, for example, heat treatment, application of mechanical stresses, chemical etching, or a combination of at least two of these operations.

The seed layer 5 may consist of a material for which the thermal expansion coefficient is equal to $(1+\in)$ times that of the receiving support 3, with $\in$ of the order of 0.2, and preferably $\in$ equals 0.1. It will however be observed that thermal expansion may vary with temperature, with the deposition technique, with the defects present inside the layers and also with the measurement techniques. Thus, when the structure is undergoing heat treatments (e.g., during detachment of the seed layer 5 and the useful layer 6 of the receiving substrate 3) the seed layer 5 and the receiving support 3 will substantially expand in the same way. The receiving support 3 will expand slightly less than the seed layer 5 so that the latter may be placed under slight compression, thereby avoiding deterioration of the seed layer 5.

The useful layer 6 may consist of a material which has a thermal expansion coefficient which is larger than or equal to $(1\pm\in')$ times that of the receiving support 3, with the value of $\in'$ between 0 and 0.8 and, preferably, between 0.2 and 0.3. Expansions of the different layers 5, 6 and the receiving support 3 of the same order of magnitude during heat treatments may be obtained because of the closeness of the thermal expansion coefficients of the useful layer 6, the seed layer 5 and the receiving support 3. In this way, any risk of deterioration of the substrate or occurrence of a residual deflection of the final substrate may be avoided.

The seed layer 5 and/or the receiving support 3 may comprise a material such as, for example, silicon (e.g., {111} silicon), germanium, polycrystalline or monocrystalline silicon carbide, GaN, GaAs, polycrystalline or monocrystalline AN, and sapphire. Further, the chemical composition of the seed layer 5 may be identical with that of the receiving support 3.

Between the steps for detaching 200 and for depositing 300 the useful layer, the method may also include steps for preparing the surface of the seed layer 5. These preparation steps may include, for example, polishing, annealing, smooth annealing operations (e.g., under hydrogen), annealing operations for strengthening the bond, sacrificial oxidization interface operations (i.e., for oxidizing and then removing the oxidized material), etching operations, etc.

Step 400 may lead to detachment at the bonding layer 4 of the assembly, consisting of the seed layer 5 and the useful layer 6, from the receiving support 3. If a self-supported substrate is desired, the assembly formed by the seed layer 5 and the useful layer 6 may only be able to be detached from the receiving support 3 if the thickness of the assembly is greater than or equal to 50 µm.

In order to perform the detachment, different techniques may be used. For example, detachment may be accomplished by application of mechanical, thermal, electrostatic stresses; application of any type of etching (wet, dry, gas, etching, plasma etching, etc.) and/or application of any type of etching by irradiation such as laser irradiation (e.g., by chemical etchings at the bonding layer 4), or the like. The receiving substrate 3, which may either be destroyed or recycled in order to reuse it during the making of a new substrate, may then be obtained on the one hand, and a structure consisting of the seed layer 5 and the useful layer 6 may be obtained on the other hand. It will be appreciated that for performing the detachment of the assembly (consisting of the seed layer 5 and the useful layer 6) from the receiving support 3 at the bonding layer 4, chemical etching may advantageously be used if the receiving substrate 3 is intended to be destroyed. On the other hand, if the receiving substrate 3 is intended to be recycled for reuse, mechanical stress or chemical etching of the bonding layer 4 may preferably be used, which provides full detachment of substrate 3. The seed layer 5 may then be removed by any appropriate means known to those skilled in the art.

Thereafter, the useful layer 6 may be transferred onto a final supporting substrate 7. The final support (or second surrogate substrate) 7 may be made of a material such as, for example, sapphire, semi-conducting or semi-conductive materials (e.g., silicon, germanium, etc.), metals (e.g., copper), plastic materials and glasses. Since the resultant structure no longer undergoes any heat treatment, the final supporting substrate 7 may be made with any material which has a thermal expansion coefficient and/or a lattice parameter different from those of the useful layer 6.

In a preferred embodiment, the useful layer 6 may be transferred onto the final supporting substrate 7 by bonding. The bond may be obtained by applying a bonding layer 8 on one of the surfaces of the useful layer 6 and/or the final supporting substrate 7. Similar to selecting the final substrate 7, the bonding techniques applied in this step are not limited by temperature resistance, contaminations, the thermal expansion coefficient and/or the lattice parameter of the useful layer 6.

The layer 8 used may comprise, for example, organic layers (e.g., insulating layers of the $SiO_2$, $Si_3N_4$, or polyimides), conductive metal interfaces and seals (e.g., palladium silicide $Pd_2Si$, tungsten silicide $WSi_2$, SiAu, or PdIn). The conductive interfaces may then provide the contact on the rear face of the layer.

Moreover, structures may be buried in this bonding layer 8 so that a rear junction contact of a triple junction may thereby be made for producing solar cells. In one embodiment, the buried structure may consist of a triple junction based on amorphous silicon of the n-i-p type. This buried structure may have a lower layer (i.e., a rear contact layer) consisting of metallization, such as silver (Ag) or aluminum (Al), on which a conducting transparent oxide may be deposited. The rear contact layer, on the one hand, may provide an electrical contact with which the triple junction solar cell may be connected and a rear mirror, on the other hand, allowing reflection of light which has not been absorbed by the solar cell. The latter may consist of three amorphous silicon layers (of type n, i and p, respectively) successively deposited on the rear contact layer. It will be appreciated by those skilled in that art that when making LEDs, mirrors may also be buried in the bonding layer 8.

In an alternative embodiment (not illustrated in FIG. 1), the useful layer 6 and the seed layer 5 may be transferred onto the final supporting substrate 7 with or without the bonding layer 8 prior to removing the seed layer 5.

Figure 2:
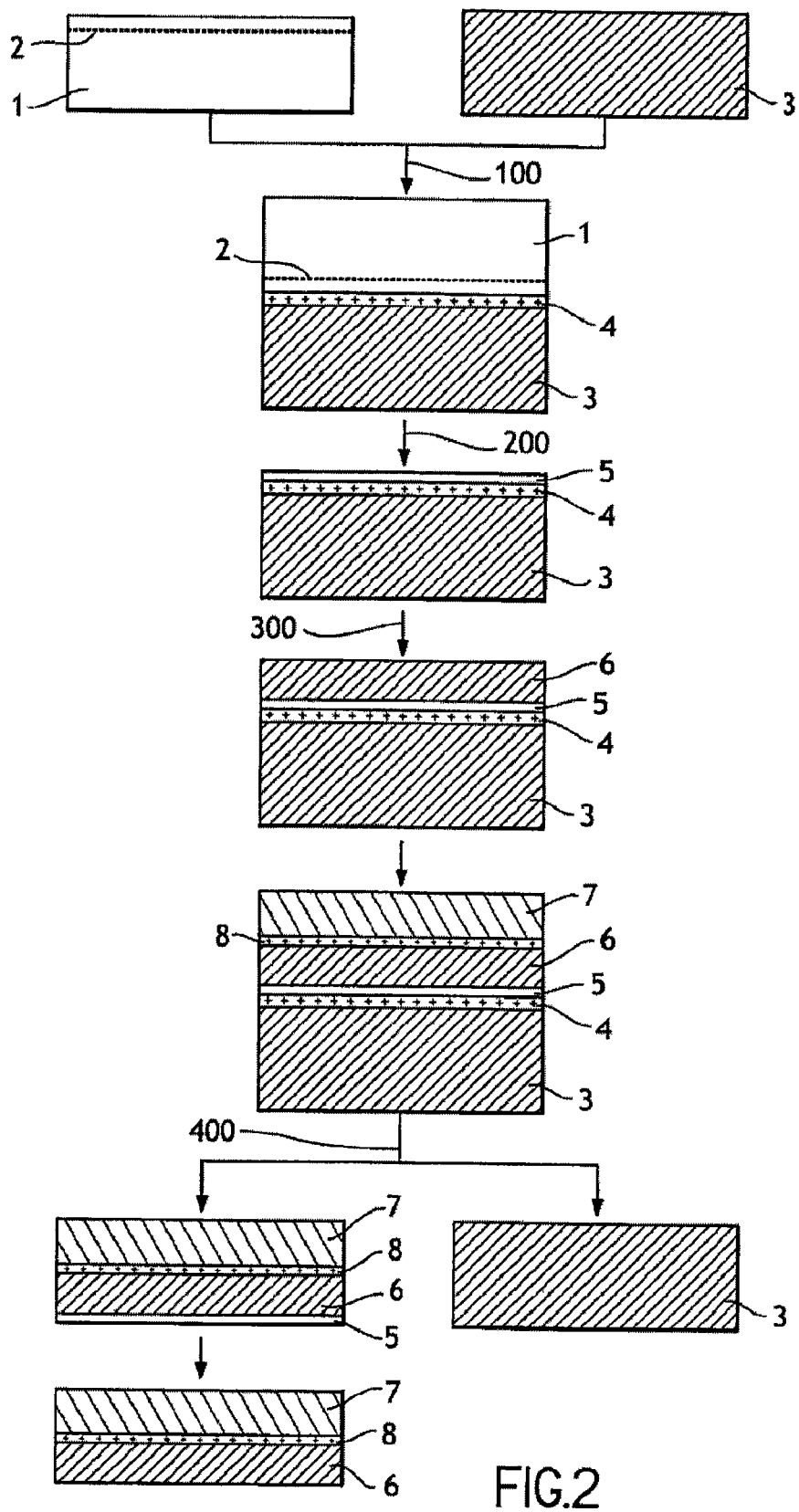
FIG. 2 is a schematic illustration of the steps of an alternative exemplary embodiment of a method for making a substrate.
Figure 3A:
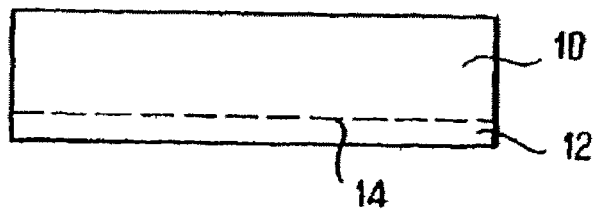
FIGS. 3A to 3G illustrate the successive steps of a method in accordance with one embodiment of the invention.
Figure 3B:
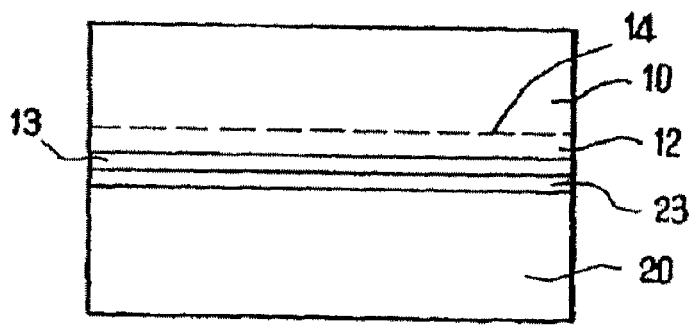
Figure 3C:
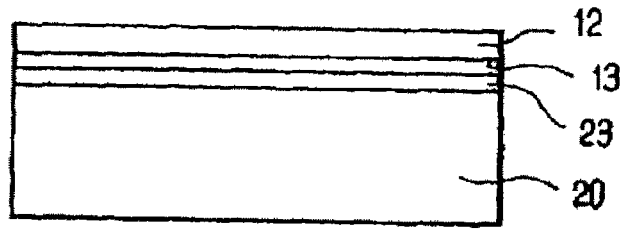
Figure 3D:
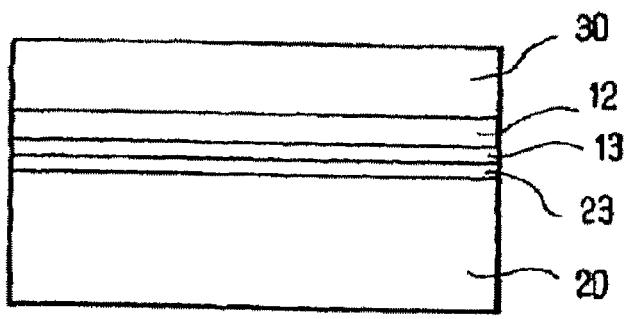
Figure 3E:
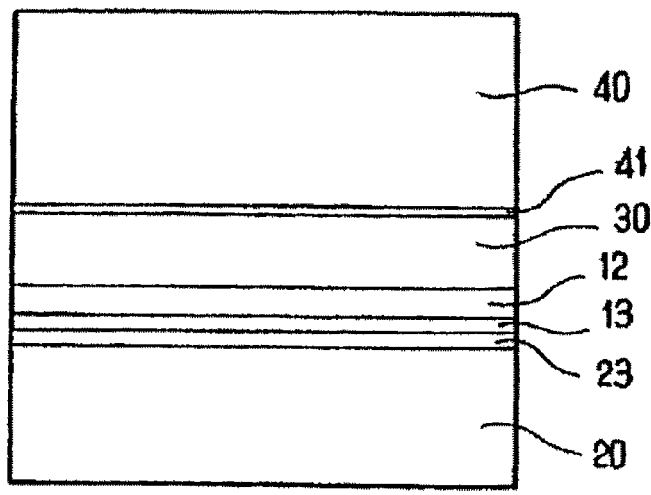
Figure 3F:
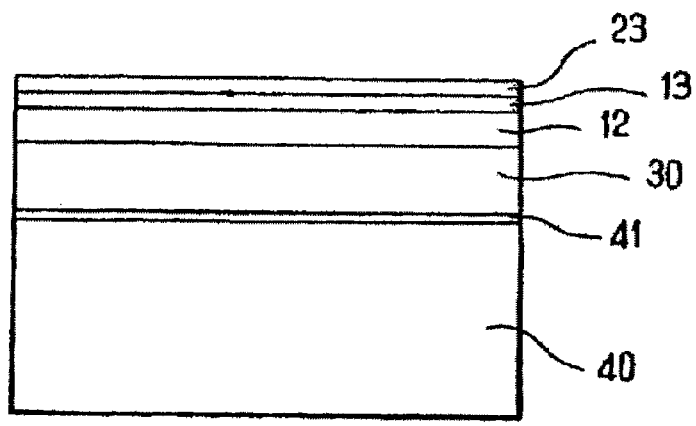
Figure 3G:
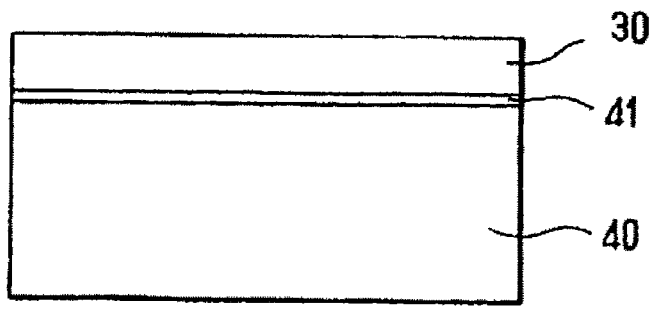

Referring now to FIG. 2, atomic species may be implanted in the same way as previously discussed—at a determined depth of a donor substrate 1—in order to form a weakened area 2. The donor substrate 1 in step 100 may then be adhered on a receiving substrate 3 by any appropriate means. In step 200, a seed layer 5 may be detached from the donor substrate 1 at the weakened area 2. Thereafter, in step 300, a useful layer 6 may be deposited on the surface of the seed layer 5. Detachment of the seed layer 5 and the donor substrate 1 may be achieved by an operation such as, for example, heat treatment, application of mechanical stresses and chemical etching, or a combination of at least two of these operations.

In another alternative embodiment, the seed layer 5 may originate from the thinning of the donor substrate (for example according to a BESOI type method) before depositing the useful layer 6. The final supporting substrate 7 may then be transferred onto the useful layer 6 by means of a bonding layer 8. Stresses may be applied in order detach the structure, which may consist of the seed layer 5, the useful layer 6, the bonding layer 8 and the final supporting substrate 7, from the receiving support 3 at the bonding layer 4. A receiving substrate 3, ready to be recycled, may be obtained on the one hand and a structure consisting of the seed layer 5, the useful layer 6, the bonding layer 8 and the final supporting substrate 7 may be obtained on the other hand. The seed layer 5 may then be removed by any appropriate means in order to obtain the final substrate.

EXAMPLES

Two particular but non-limiting exemplary embodiments of the methods and resultant substrates of this invention will be described hereafter with reference to FIG. 2. The methods are intended for making solar cells (Example 1) and light-emitting diodes (Example 2). It should be noted, however, that the examples are not intended to be limiting as to the fields of application of the invention.

Example 1

According to this example, a weakened area 2 may be made by implanting atomic species at a determined depth in a donor substrate (or semiconductor carrier) 1 which may be made of, for example, germanium (Ge), silicon (Si), gallium arsenide (GaAs), and the like. A receiving substrate (or support substrate) 3, which may also be made of semiconductors (e.g., Si or Ge), insulating material (e.g., sapphire), and the like, may be bonded to the donor substrate 1 by means of a bonding layer 4, thereby forming composite structure 9. The bonding layer 4, preferably made of nitride or oxide, may be formed on the face of at least one of the donor 1 or receiving 3 substrates.

As shown in step 200, a seed layer (or growth substrate) 5 may be detached from the donor substrate 1 at the weakened area 2 using the SMART-CUT® method as described herein. The seed layer 5 may have a thermal expansion coefficient (which is also noted as CTE) which varies from 4.6 to 6.67× $10^{-6}$ (for Ge) for temperatures ranging from 25° C. to 600° C. Detachment of the seed layer 5 and the donor substrate 1 may be achieved by an operation such as, for example, heat treatment, application of mechanical stresses and chemical etching, or a combination of at least two of these operations.

As illustrated in step 300, a useful gallium arsenide layer 6 may then be deposited on the surface of the seed layer 5. The CTE of AsGa may be from 5.00 to 7.4×$10^{-6}$ for temperatures ranging from 25° C. to 600° C. Different layers, such as, for example, InP, AsGa, GaInP, InGaAs, InGaAlP, or InGaAsN epitaxied layers, may be successively deposited by epitaxy on the deposit of the AsGa layer in order to form an epitaxial stack for making junctions (e.g., triple junctions, quadruple junctions, etc.). It will be appreciated that the useful layer 6 may have a crystalline quality at least equal to the crystalline quality which may be obtained by epitaxy on a massive Ge substrate.

The useful layer 6 and the seed layer 5 may then be transferred onto a final supporting substrate (or surrogate second substrate) 7. It will be noted that the final support 7 may also be contacted with the epitaxial stack if the latter is made beforehand. The final support 7 may be made of a material such as, for example, sapphire, semi-conductors (e.g., silicon, germanium, GaAs), plastic materials and glasses. Transfer of the useful layer 6 and the seed layer 5 onto the final supporting substrate 7 may be performed by bonding. The bond may be performed using a bonding layer 8 made of, for example, insulating layers (e.g., $SiO_2$, $Si_3N_4$, etc.), organic layers (e.g., polyimides), metal layers (e.g., palladium silicide $Pd_2Si$ and tungsten silicide $WSi_2$), and seals (e.g., SiAu, PdIn, etc.).

The final supporting substrate 7, the seed layer 5 and the useful layer 6 may then be detached by any appropriate means, for example, at the bonding layer 4 from the receiving support 3. The receiving support 3 may thereafter be recycled advantageously. This detachment may be obtained by applying stresses at the bonding interface such as, for example, mechanical stresses, thermal stresses, electrostatic stresses and stresses from laser irradiation. Thereafter, the seed layer may be removed in order to obtain the final substrate consisting of the final supporting substrate 7 of the bonding layer 8 and the useful layer 6 or the epitaxial stack.

Example 2

A weakened area 2 may be achieved by implanting atomic species at a determined depth in the donor substrate 1 made of massive sapphire (which has a CTE that varies from 4 to 9.03 $10^{-6}$ for temperatures ranging from 25° C. to 1,000° C.) or semiconductors (e.g., silicon, germanium GaAs). The implantation may consist of implanting hydrogen at a dose between $0.5×10^{17}$ and $3×10^{17}$ at/$cm^2$, preferably, between 1 and $2×10^{17}$ at/$cm^2$ and an energy of the order of 20 to 210 keV, preferably 100 keV. The receiving substrate 3 also may also be made of massive sapphire and may be adhered to the substrate 1 by means of a bonding layer 4. The bonding layer 4 may reach a thickness of one micron which may thereby facilitate subsequent detachment of the receiving supporting substrate 3 by side chemical etching of this bonding layer 4.

As shown in step 200, a seed layer 5 may be detached from the donor substrate 1 at the weakened area 2 by following the SMART-CUT® method. Thereafter, in step 300, useful layers 6 may be deposited on the surface of the seed layer 5. The useful layers 6 may be deposited by epitaxy based on, for example, GaN, AN, InGaN, InN and their ternary compounds (AlGaN, InGaN). Useful layers can also be based on the materials of Example 1.

Detachment of the seed layer 5 and the donor substrate 1 may be achieved by an operation such as, for example, heat treatment, application of mechanical stresses and chemical etching, or a combination of at least two of these operations.

The useful layer 6 and the seed layer 5 may then be transferred onto a final supporting substrate 7 of sapphire or a material such as, for example, semiconductors (e.g., silicon, germanium GaAs), copper, plastic materials, and glass. This transfer of the useful layer 6 and the seed layer 5 onto the final supporting substrate 7 may be performed by bonding. The bond being obtained by using a bonding layer made of, for example, insulating layers (e.g., $SiO_2$, $Si_3N_4$, etc), organic layers (e.g., polyimides), metal layers (e.g., palladium silicide $Pd_2Si$ and tungsten silicide $WSi_2$) or seals (e.g., SiAu, PdIn).

The final supporting substrate 7, the seed layer 5 and the useful layer 6 may then be detached by any appropriate means, at the bonding layer 4, from the receiving support 3. The receiving support 3 may advantageously be recycled.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. One skilled in the art will appreciate that the invention may be used with many modifications of structure, arrangement, proportions, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims, and not limited to the foregoing description.

The words "significant" and "likely" (and similar words of degree) are used here to mean within acceptable and expected limits, usually commercially-acceptable limits. For example, in the phrase "significant wafer damage is unlikely in the process", the phrase "significant wafer damage" is taken to mean damage that limits or prevents intended, usually commercial applications of the wafer. The phrase "unlikely in the process" is taken to mean that, although significant damage may occur, it occurs sufficiently rarely that commercial use of the process is not hindered or prevented. The ranges signified by these terms depend on commercial requirements (or research requirements, or the like) and can vary but in all cases are not to be construed and imposing requirements beyond what are currently achievable given a current state-of-the-art. It should be understood that this invention is not limited to commercial uses; intended uses include research uses, special purpose uses, and so forth.

What is claimed is:

1. A method of manufacturing a solar cell, which comprises:
   providing a donor substrate with a prepared bonding surface;
   providing a receiving substrate;
   bonding the donor substrate and the receiving substrate to produce a composite structure;
   detaching the bulk of the donor substrate, leaving a semiconductor seed layer on the receiving substrate;
   depositing a sequence of layers of semiconductor material forming a solar cell on the semiconductor seed layer;
   bonding a final support substrate on top of the sequence of layers of semiconductor material forming the solar cell; and
   removing the receiving substrate and the semiconductor seed layer leaving the sequence of layers of semiconductor material forming the solar cell.

2. The method of claim 1, wherein removing the receiving substrate further comprises detaching the final support substrate, the sequence of layers and the seed layer from the receiving substrate.

3. The method of claim 1, wherein removing the receiving substrate further comprises chemical treatment and application of mechanical, thermal, laser irradiation stress or combination thereof to remove at least one of the receiving substrate or the semiconductor seed layer.

4. The method of claim 1, which further comprises preparing for bonding one or both of the bonding surfaces of the donor substrate and the receiving substrate by forming a bonding layer thereon.

5. The method of claim 1, wherein one or both of the bonding surfaces of the donor substrate and the receiving substrate have been prepared for bonding, and wherein bonding the donor substrate and the receiving substrate to produce the composite structure comprises molecular adhesion of the prepared bonding surface of the donor substrate directly to a surface of the receiving substrate.

6. The method of claim 1, which further comprises preparing the seed layer to receive the sequence of layers of semiconductor material, wherein the preparation includes at least one of polishing, annealing, smoothing, oxidation, and etching.

7. The method of claim 1, wherein detaching the bulk of the donor substrate from the composite structure comprises:
   implanting a species into the donor substrate to form a detachment zone defining a seed layer in the donor substrate;
   bonding the seed layer to the receiving substrate; and
   detaching the bulk of the donor substrate from the composite structure, leaving the seed layer bonded on the receiving substrate.

8. The method of claim 7, wherein detaching the bulk of the donor substrate from the composite structure comprises:
   treating the composite structure at an elevated temperature to weaken the donor substrate at the detachment zone; and
   detaching the bulk of the donor substrate from the composite structure along the detachment zone after or during heat treatment of the composite structure.

9. The method of claim 7, wherein detaching the bulk of the donor substrate from the composite structure comprises application of at least one of mechanical stress and chemical etching, or a combination thereof.

10. The method of claim 1, which further comprises removing the receiving substrate for recycling and reuse.

11. The method of claim 1, wherein the seed layer comprises gallium arsenide, germanium, sapphire, neodymium gallate, or lithium gallate.

12. The method of claim 1, wherein the receiving substrate comprises sapphire.

13. The method of claim 1, wherein the semiconductor material comprises one or more of InP, AsGa, GaInP, InGaAs, InGaAlP, or InGaAsN.

14. The method of claim 1, wherein the receiving substrate and seed layer are made of a material selected from the group consisting of silicon, gallium arsenide, zinc oxide, lithium gallium oxide and lithium aluminum oxide, monocrystalline AlN, polycrystalline AlN, monocrystalline SiC, polycrystalline SiC, GaN, germanium.

15. The method of claim 4, wherein the bonding layer comprises at least one of silicon oxide or silicon nitride.

16. The method of claim 1, wherein the final support substrate comprises at least one of monocrystalline or polycrystalline silicon or sapphire or semiconductor such as germanium, plastic, glasses, metals such as copper.

17. The method of claim 1, wherein the final support substrate is bonded with the sequence of layers of semiconductor material with bonding layer in a material chosen at least among organic materials or a conductive metallic interface layer.

18. The method of claim 17, wherein the organic materials of the bonding layer are polyimides.

19. The method of claim 17, wherein the conductive metallic interface layer of the bonding layer comprises $PdSi_2$, $WSi_2$, SiAu, PdIn and $SiO_2$, or $Si_3N_4$.

20. The method of claim 1 further comprising removing the final support substrate leaving the sequence of layers of semiconductor material forming the solar cell.

* * * * *

UNITED STATES PATENT AND TRADEMARK OFFICE
CERTIFICATE OF CORRECTION

PATENT NO. : 7,939,428 B2  
APPLICATION NO. : 12/914194  
DATED : May 10, 2011  
INVENTOR(S) : Boussagol et al.

It is certified that error appears in the above-identified patent and that said Letters Patent is hereby corrected as shown below:

Title Page:  
Item (30) Foreign Application Priority Data, delete the following:  
"Nov. 27, 2000 (FR) ............... 00 15279"  
"Jun. 11, 2002 (FR) ............... 02 07132"  
"Jan. 24, 2003 (FR) ............... 03 00780".

Item (56) References Cited, Other Publications:  
Friedman et al. reference: change "4$^{tha}$World" to -- 4$^{th}$ World --.  
Venkatasubramanian et al. reference: change "AIGaAs/GaAs" to -- AlGaAs/GaAs --.  
Wanlass et al. reference (second occurrence): change "GaInP/GaAs/GaInAs" to  
-- GaInP/GaAs/GaInAs --.

Signed and Sealed this  
Twenty-first Day of June, 2011

David J. Kappos  
*Director of the United States Patent and Trademark Office*